United States Patent
Hsu et al.

(10) Patent No.: US 11,282,750 B2
(45) Date of Patent: *Mar. 22, 2022

(54) CONTACT STRUCTURE AND METHOD OF FABRICATING THE SAME

(71) Applicant: Taiwan Semiconductor Manufacturing Co., Ltd., Hsinchu (TW)

(72) Inventors: Wan Hsuan Hsu, Taoyuan (TW); I-Hsiu Wang, Yongkang (TW); Yean-Zhaw Chen, Tainan (TW); Cheng-Wei Chang, Hsinchu (TW); Yu Shih Wang, Tainan (TW); Hsin-Yan Lu, New Taipei (TW); Yi-Wei Chiu, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/010,995

(22) Filed: Sep. 3, 2020

(65) Prior Publication Data
US 2020/0402859 A1    Dec. 24, 2020

Related U.S. Application Data

(60) Continuation of application No. 16/016,962, filed on Jun. 25, 2018, now Pat. No. 10,770,356, which is a
(Continued)

(51) Int. Cl.
*H01L 21/8234* (2006.01)
*H01L 29/417* (2006.01)
(Continued)

(52) U.S. Cl.
CPC .. *H01L 21/823475* (2013.01); *H01L 21/0217* (2013.01); *H01L 21/0274* (2013.01);
(Continued)

(58) Field of Classification Search
CPC ........ H01L 21/823475; H01L 21/76897; H01L 21/76804; H01L 21/823468; H01L 21/76877
See application file for complete search history.

(56) References Cited

U.S. PATENT DOCUMENTS

| 5,607,879 A | 3/1997 | Wuu et al. |
| 6,359,307 B1 | 3/2002 | Wang et al. |

(Continued)

FOREIGN PATENT DOCUMENTS

| CN | 103915384 A | 7/2014 |
| CN | 105845652 A | 8/2016 |

*Primary Examiner* — Jose R Diaz
(74) *Attorney, Agent, or Firm* — Slater Matsil, LLP

(57) ABSTRACT

An apparatus includes a first source and a common drain and on opposite sides of a first gate surrounded by a first gate spacer, a second source and the common drain on opposite sides of a second gate surrounded by a second gate spacer, a first protection layer formed along a sidewall of the first gate spacer, wherein a top surface of the first protection layer has a first slope, a second protection layer formed along a sidewall of the second gate spacer, wherein a top surface of the second protection layer has a second slope, a lower drain contact between the first gate and the second gate and an upper drain contact over the lower drain contact and between the first gate and the second gate, wherein at least a portion of the upper drain contact is in contact with the first slope and the second slope.

20 Claims, 12 Drawing Sheets

Related U.S. Application Data division of application No. 15/364,136, filed on Nov. 29, 2016, now Pat. No. 10,037,918.

(51) Int. Cl.
*H01L 21/768* (2006.01)
*H01L 29/66* (2006.01)
*H01L 21/311* (2006.01)
*H01L 29/78* (2006.01)
*H01L 21/02* (2006.01)
*H01L 21/027* (2006.01)
*H01L 27/02* (2006.01)
*H01L 29/08* (2006.01)
*H01L 27/088* (2006.01)

(52) U.S. Cl.
CPC .. *H01L 21/02178* (2013.01); *H01L 21/31111* (2013.01); *H01L 21/31116* (2013.01); *H01L 21/31144* (2013.01); *H01L 21/76802* (2013.01); *H01L 21/76804* (2013.01); *H01L 21/76877* (2013.01); *H01L 21/76897* (2013.01); *H01L 21/823468* (2013.01); *H01L 27/0207* (2013.01); *H01L 29/0847* (2013.01); *H01L 29/41725* (2013.01); *H01L 29/41758* (2013.01); *H01L 29/41775* (2013.01); *H01L 29/41783* (2013.01); *H01L 29/41791* (2013.01); *H01L 29/665* (2013.01); *H01L 29/78* (2013.01); *H01L 21/76829* (2013.01); *H01L 21/823425* (2013.01); *H01L 27/088* (2013.01)

(56) References Cited

U.S. PATENT DOCUMENTS

| | | | |
|---|---|---|---|
| 7,071,517 | B2 | 7/2006 | Kim et al. |
| 8,129,235 | B2 | 3/2012 | Chou et al. |
| 9,412,660 | B1 | 8/2016 | Xie et al. |
| 10,037,918 | B2 * | 7/2018 | Hsu .................. H01L 21/76877 |
| 2007/0077709 | A1 | 4/2007 | Kim |
| 2008/0230917 | A1 | 9/2008 | Chou et al. |
| 2013/0049222 | A1 | 2/2013 | Woo |
| 2016/0163593 | A1 | 6/2016 | Tsukamoto |

* cited by examiner

CONTACT STRUCTURE AND METHOD OF FABRICATING THE SAME

PRIORITY CLAIM AND CROSS-REFERENCE

This application is a continuation of U.S. application Ser. No. 16/016,962, filed on Jun. 25, 2018, now U.S. Pat. No. 10,770,356 issued Sep. 8, 2020, entitled "Contact Structure and Method of Fabricating the Same," which is a divisional of U.S. application Ser. No. 15/364,136, filed on Nov. 29, 2016, now U.S. Pat. No. 10,037,918 issued Jul. 31, 2018, entitled "Contact Structure and Method of Fabricating the Same," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. However, the smaller feature size may lead to the undesirable increase in contact resistance. As the demand for miniaturization, higher speed and greater bandwidth, as well as lower power consumption and latency has grown recently, there has grown a need for reducing contact resistance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
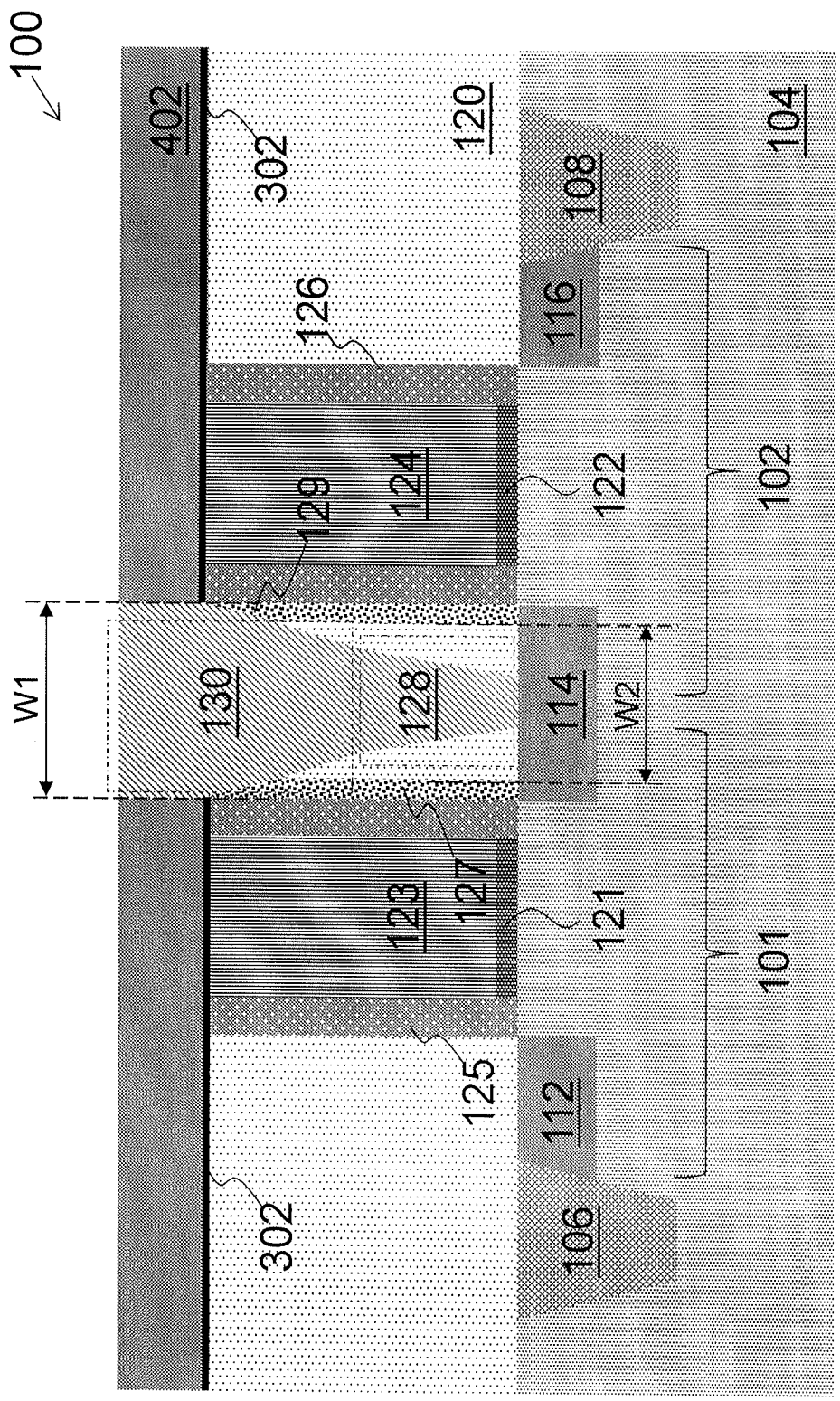
FIG. 1 illustrates a cross sectional view of a semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure will be described with respect to embodiments in a specific context, a drain contact structure having an enlarged top critical dimension and a method of forming the same. The embodiments of the disclosure may also be applied, however, to a variety of semiconductor structures. For example, the fabrication process may be applicable to forming a source contact structure. Furthermore, the embodiments of the disclosure are applicable to not only planar transistor devices, but also to fin field effect transistor (FinFET) devices. Hereinafter, various embodiments will be explained in detail with reference to the accompanying drawings.

FIG. 1 illustrates a cross sectional view of a semiconductor device in accordance with various embodiments of the present disclosure. A semiconductor device 100 comprises two transistors sharing a common drain. These two transistors are formed over a substrate 104 and at least partially between a first isolation region 106 and a second isolation region 108. A first transistor 101 comprises a first gate electrode 123 and its gate dielectric layer 121, a drain 114 and its contacts 128 and 130, and a first source 112 and its contact (not shown). A second transistor 102 comprises a second gate electrode 124 and its gate dielectric layer 122, the drain 114 and its contacts 128 and 130, and a second source 116 and its contact (not shown).

It should be noted that the common drain structure shown in FIG. 1 is selected purely for demonstration purposes and is not intended to limit the various embodiments of the present disclosure. One of ordinary skill in the art would recognize many variations, alternatives, and modifications. For example, the semiconductor device 100 may comprise two transistors sharing a common source.

As shown in FIG. 1, a first gate spacer 125 is formed immediately adjacent to the first gate electrode 123. The first gate spacer 125 includes two portions from the cross sectional view shown in FIG. 1. A first portion is formed on one side of the first gate electrode 123. A second portion is formed on an opposite side of the first gate electrode 123. The first source 112 and the first gate electrode 123 are separated by the first portion of the first gate spacer 125. The drain 114 and the first gate electrode 123 are separated by the second portion of the first gate spacer 125.

A second gate spacer 126 is formed immediately adjacent to the second gate electrode 124. Likewise, the second source 116 and the second gate electrode 124 are separated by the second gate spacer 126.

The gate electrodes 123 and 124 are formed in an interlayer dielectric layer 120. An etch stop layer 302 is formed over the interlayer dielectric layer 120. A dielectric layer 402 is formed over the etch stop layer 302. Drain contacts 128 and 130 are formed between the first gate electrode 123 and the second gate electrode 124.

The drain contact 128 is embedded in the interlayer dielectric layer 120 and between the first gate electrode 123 and the second gate electrode 124. A bottom surface of the drain contact 128 is contact with the drain 114. It should be noted that a silicide region (not shown) may be formed between the drain 114 and the drain contact 128 to improve the contact resistance of the drain 114. Throughout the description, the drain contact 128 is alternatively referred to as a lower drain contact 128.

In some embodiments, the lower drain contact 128 has an inverted-trapezoidal shape as shown in FIG. 1. The shape of the lower drain contact 128 shown in FIG. 1 is merely an example. A person skilled in the art would understand the lower drain contact 128 may comprise other shapes, such as, but not limited to rectangular, square, trapezoidal and the like.

As shown in FIG. 1, the drain contact 130 is stacked on the drain contact 128. Throughout the description, the drain contact 130 is alternatively referred to as an upper drain contact 130. A lower portion of the upper drain contact 130 is inverted-trapezoidal in shape and between the first gate electrode 123 and the second gate electrode 124. An upper portion of the drain contact 130 is rectangular in shape and extends through the dielectric layer 402 and the etch stop layer 302.

As shown in FIG. 1, the width of the bottom of the upper drain contact 130 is approximately equal to the width of the top of the lower drain contact 128. A middle portion of the upper drain contact 130 is adjacent to the first gate spacer 125 and the second gate spacer 126. In order to protect the sidewalls of the gate spacers as well as the gate electrodes 123 and 124, a first protection layer 127 is formed between the drain contacts and the first gate spacer 125. A second protection layer 129 is formed between the drain contacts and the second gate spacer 126.

It should be noted that while FIG. 1 illustrates two separate protection layers 127 and 129 from the cross sectional view of the semiconductor device 100, one of ordinary skill in the art would recognize many variations, alternatives, and modifications. For example, in some embodiments, the protection layers 127 and 129 may be portions of a continuous protection layer.

As shown in FIG. 1, the top surface of the first protection layer 127 has a slope extending downward from an edge of a top surface of the first gate spacer 125. Likewise, the top surface of the second protection layer 129 has a slope extending downward from an edge of a top surface of the second gate spacer 126. The slopes of the protection layers 127 and 129 help to increase the size of the trench where the upper drain contact 130 is formed, thereby improving the metal gap fill of the drain contacts. As shown in FIG. 1, the width of the trench has been increased from W2 to W1. W2 is the minimum distance between the first protection layer 127 and the second protection layer 129. W1 is the width of the upper portion of the upper drain contact 130. In some embodiments, the ratio of W1 to W2 is in a range from about 1.1 to about 1.3.

One advantageous feature of having the enlarged trench shown in FIG. 1 is the enlarged trench helps to reduce the contact resistance, thereby improving the performance of the semiconductor device 100. For example, the resistive-capacitive (R-C) delay of the semiconductor device 100 may be improved through the enlarged drain contact 130 as shown in FIG. 1. The detailed process of forming the upper drain contact 130, and the protection layers 127 and 129 will be described below with respect to FIGS. 2-10

FIGS. 2-10 illustrate intermediate steps of fabricating the semiconductor device shown in FIG. 1 in accordance with various embodiments of the present disclosure. It should be noted that the fabrication steps as well as the semiconductor structure shown in FIGS. 2-10 are merely an example. A person skilled in the art will recognize there may be many alternatives, variations and modifications.

Figure 2:
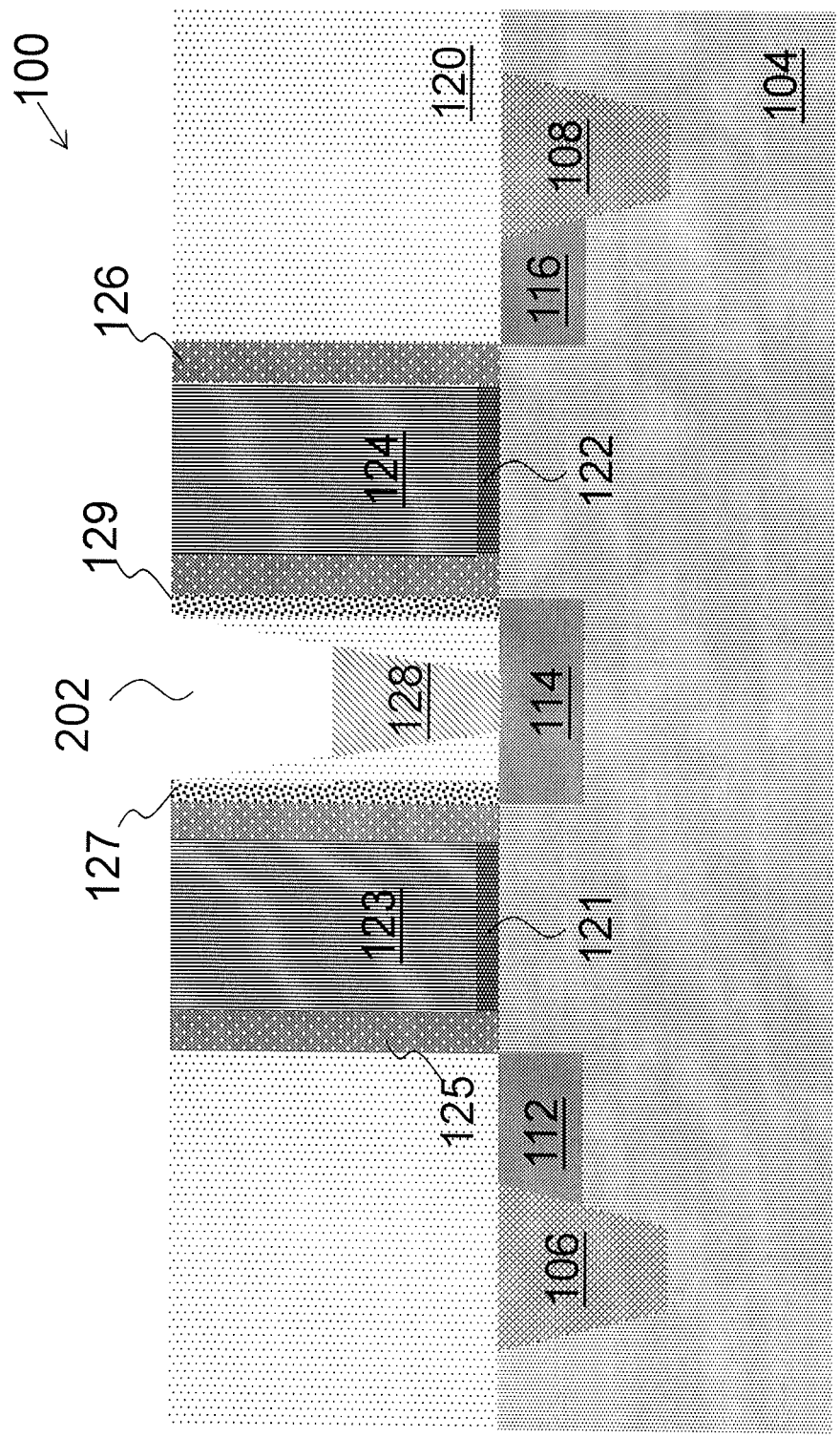
FIGS. 2-10 illustrate intermediate steps of fabricating the semiconductor device shown in FIG. 1 in accordance with various embodiments of the present disclosure.

FIG. 2 illustrates a cross sectional view of a semiconductor device after a lower drain contact has been formed over the drain of the semiconductor device in accordance with various embodiments of the present disclosure. The semiconductor device 100 is formed over the substrate 104. More particularly, the drain 114, and the sources 112 and 116 are formed in the substrate 104 and between two isolation regions 106 and 108. The gate electrodes 123 and 124 are formed in the interlayer dielectric layer 120. The lower drain contact 128 is formed between the gate electrodes 123 and 124.

The substrate 104 may be formed of silicon, although it may also be formed of other group III, group IV, and/or group V elements, such as silicon, germanium, gallium, arsenic, and combinations thereof. The substrate 104 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 104 may further comprise a variety of electrical circuits such as transistors (e.g., transistor 101 and transistor 102). For simplicity, only two transistors having a shared drain are presented to illustrate the innovative aspects of various embodiments.

The electrical circuits formed on the substrate 104 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and the like. The electrical circuits may be interconnected to perform one or more functions. The functions may include memory structures, processing structures, sensors, amplifiers, power distribution, input/output circuitry or the like.

In accordance with an embodiment, the substrate 104 may be a p substrate, which is doped with a p-type impurity such as boron, indium or the like. Depending on design needs and different applications, a p-type epitaxial layer (not shown) may be grown from the p-type substrate 104. The sources 112, 116 and drain 114 may be formed in the p-type epitaxial layer. The epitaxial growth of the p-type epitaxial layer may be implemented by using suitable semiconductor fabrication processes such as chemical vapor deposition (CVD), ultra-high vacuum chemical vapor deposition (UHV-CVD) and the like.

As shown in FIG. 2, the first source 112 and the drain 114 are formed on opposing sides of the first gate electrode 123. The second source 116 and the drain 114 are formed on opposing sides of the second gate electrode 124. In an embodiment in which the substrate 104 is an n-type substrate, the drain and source regions may be formed by implanting appropriate p-type dopants such as boron, gallium, indium and/or the like. Alternatively, in an embodiment in which the substrate 104 is a p-type substrate, the drain and source regions may be formed by implanting appropriate n-type dopants such as phosphorous, arsenic and/or the like.

The isolation regions 106 and 108 may be shallow trench isolation (STI) regions, and may be formed by etching the substrate 104 to form a plurality of trenches and filling the trenches with a dielectric material as is known in the art. For example, the isolation regions 106 and 108 may be filled with a dielectric material such as an oxide material, a high-density plasma (HDP) oxide and/or the like. A planarization process such as a chemical mechanical polish (CMP) process may be applied to the top surface so that the excess dielectric material may be removed as a result.

The gate dielectric layers 121 and 122 may be formed of a dielectric material such as silicon oxide, silicon oxynitride, silicon nitride, an oxide, a nitrogen-containing oxide, a combination thereof and/or the like. The gate dielectric layers 121 and 122 may have a relative permittivity value greater than about 4. Other examples of such materials include aluminum oxide, lanthanum oxide, hafnium oxide, zirconium oxide, hafnium oxynitride, combinations thereof and/or the like. In an embodiment in which the gate dielectric layers 121 and 122 comprise an oxide layer, the gate dielectric layers 121 and 122 may be formed by a plasma enhanced CVD (PECVD) process using tetraethoxysilane (TEOS) and oxygen as a precursor. In accordance with an embodiment, the gate dielectric layers 121 and 122 may be of a thickness in a range from about 8 Angstroms to about 200 Angstroms.

The gate electrodes 123 and 124 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In an embodiment in which the gate electrodes 123 and 124 are formed of poly-silicon, the gate electrodes 123 and 124 may be formed by depositing doped or undoped poly-silicon by low-pressure chemical vapor deposition (LPCVD). Throughout the description, the gate electrodes 123 and 124 may be alternatively referred to as the first gate 123 and the second gate 124 respectively.

The gate spacers 125 and 126 may be formed by blanket depositing one or more spacer layers (not shown) over the gates 123, 124 and the substrate 104 and etching the spacer layers to form the gate spacers 125 and 126. The gate spacers 125 and 126 may comprise suitable dielectric materials such as SiN, oxynitride, SiC, SiON, oxide and/or the like. The gate spacers 125 and 126 may be formed by commonly used techniques such as CVD, PECVD, sputter and/or the like.

A first protection layer 127 is formed along the sidewall of the first gate spacer 125 and a second protection layer 129 is formed along the sidewall of the second gate spacer 126. In some embodiments, the first protection layer 127 and the second protection layer 129 may function as contact etch stop layers (CESL). The CESL layers may comprise commonly used dielectric materials, such as silicon nitride, silicon oxynitride, silicon oxycarbide, silicon carbide, combinations thereof, and multi-layers thereof. In some embodiments, besides stopping an etching process, the CESL layers also apply a stress to the channel regions of the respective transistors.

In some embodiments, the first protection layer 127 and the second protection layer 129 are portions of a continuous protection layer. The continuous protection layer is formed by depositing a dielectric layer through an atomic layer deposition (ALD) process and etching the dielectric layer to form the protection layers shown in FIG. 2. Prior to performing the ALD process on the semiconductor process 100, a pre-heating process is applied to the semiconductor device 100. The pre-heating process is employed to increase the temperature of the ALD process to a higher temperature. In some embodiments, after applying the pre-heating process to the semiconductor process 100, the temperature of the ALD process is in a range from about 550 degrees Celsius (C) to about 600 degrees C.

As shown in FIG. 2, the interlayer dielectric layer 120 is formed over the substrate 104. The interlayer dielectric layer 120 may be formed, for example, of a low-K dielectric material, such as silicon oxide. The interlayer dielectric layer 120 may be formed by any suitable method known in the art, such as spinning, CVD, PECVD and the like. It should also be noted that one skilled in the art will recognize while FIG. 2 illustrates a single interlayer dielectric layer, the interlayer dielectric layer 120 may comprise a plurality of dielectric layers.

In some embodiments, the interlayer dielectric layer 120 may comprise a lower portion and an upper portion. The lower portion and the upper portion of interlayer dielectric layer 120 are formed by two separate fabrication steps. After the lower portion has been formed, the lower drain contact 128 is formed in the lower portion of the interlayer dielectric layer 120 and between the first gate 123 and the second gate 124. The lower drain contact 128 is used to provide an electrical connection between the drain 114 and the interconnect structure (not shown) formed over the interlayer dielectric layer 120.

The lower drain contact 128 may be formed by using photolithography techniques to deposit and pattern a photoresist material on the lower portion of the interlayer dielectric layer 120. A portion of the photoresist is exposed according to the location and shape of the lower drain contact 128. An etching process, such as an anisotropic dry etch process, may be used to create an opening in the lower portion of the interlayer dielectric layer 120. A conductive liner (not shown) may be deposited prior to filling the contact opening. In some embodiments, the conductive liner is conformal, and may comprise a single layer of Ta, TaN, WN, WSi, TiN, Ru and combinations thereof. The conductive liner may be used as a barrier layer for preventing the conductive material such as copper from diffusing into the underlying substrate 104. The conductive liner may be deposited by using suitable deposition processes such as CVD, PVD, ALD and/or the like.

A conductive material is then filled in the opening. The conductive material may be deposited by using suitable deposition processes such as CVD, PVD, ALD and the like. The conductive material is deposited over the conductive liner to fill the contact opening. The conductive material may be copper, tungsten, aluminum, silver, titanium, titanium nitride, tantalum and combinations thereof and/or the like.

It should be noted a plurality of silicide regions may be formed on the top surfaces of the drain and source regions. The silicide regions may be formed by a salicide process, on the respective source/drain regions. As is known in the art, in the salicide process for forming silicide regions, a metal layer is formed by first depositing a thin layer of metal, such as cobalt, nickel, titanium, and the like, over the device. The device is then annealed to form silicide regions between the deposited metal and the underlying exposed silicon regions.

FIG. 2 further illustrates an opening 202 has been formed in the upper portion of the interlayer dielectric layer 120.

The opening 202 may be formed by applying and developing a suitable photoresist layer (not shown), and removing a portion of the upper portion of the interlayer dielectric layer 120 until the top surface of the lower drain contact 128 is exposed.

It should be noted that the gate electrodes 123 and 124 shown in FIG. 2 may be formed by a gate-last semiconductor fabrication process. More particularly, a dielectric layer (e.g., silicon oxide) and a dummy gate layer (e.g., polycrystalline silicon) are deposited over the substrate 104. Two gate stack structures are formed by etching the dielectric layer and the dummy gate layer. A dielectric material (e.g., silicon nitride) is deposited and etched to from the gate spacers 125 and 126. Then an interlayer dielectric layer (e.g., layer 120) is deposited over the substrate 104. The dummy gate layer and the dielectric layer are removed by suitable etching processes to form two gate trenches. The gate trenches are filled with a high-k dielectric material to form the gate dielectric layers 121 and 122, and a gate material to form the gate electrodes 123 and 124 as shown in FIG. 2.

Figure 3:
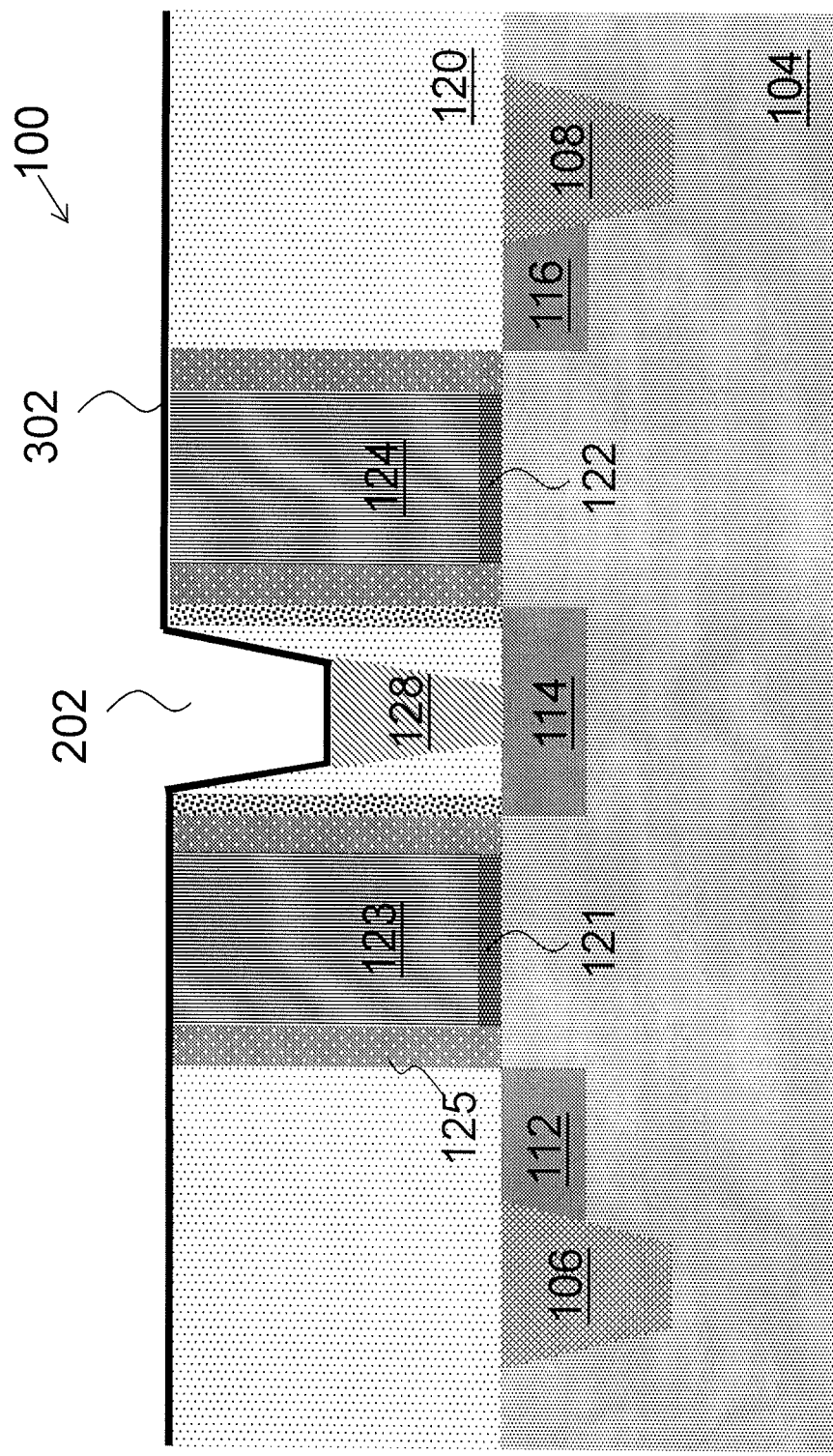

FIG. 3 illustrates a cross sectional view of the semiconductor device shown in FIG. 2 after an etch stop layer 302 is formed over the semiconductor device in accordance with various embodiments of the present disclosure. The etch stop layer 302 may be deposited in the opening 202 as well as the top surface of the interlayer dielectric layer 120. The etch stop layer 302 may be formed of aluminum oxynitride (AlON), aluminum oxide ($Al_2O_3$), aluminum nitride (AlN), hafnium oxide (HfOx), zirconium oxide (ZrOx), and combinations thereof and/or the like.

The etch stop layer 302 may be formed using suitable fabrication techniques such as CVD, although any acceptable process may be utilized to form the etch stop layer 302 to a thickness from about 10 Angstroms to about 30 Angstroms. In accordance with an embodiment, thickness of the etch stop layer 302 is approximately equal to 12 Angstroms.

In some embodiments, the etch stop layer 302 comprises a material different from that overlying the etch stop layer 302. The material difference renders the etch rate of the etch stop layer 302 much slower than that of the material overlying it. The etch stop layer 302 provides a clear indicator of when to end an etching process, thereby protecting the material underlying the etch stop layer 302.

Figure 4:
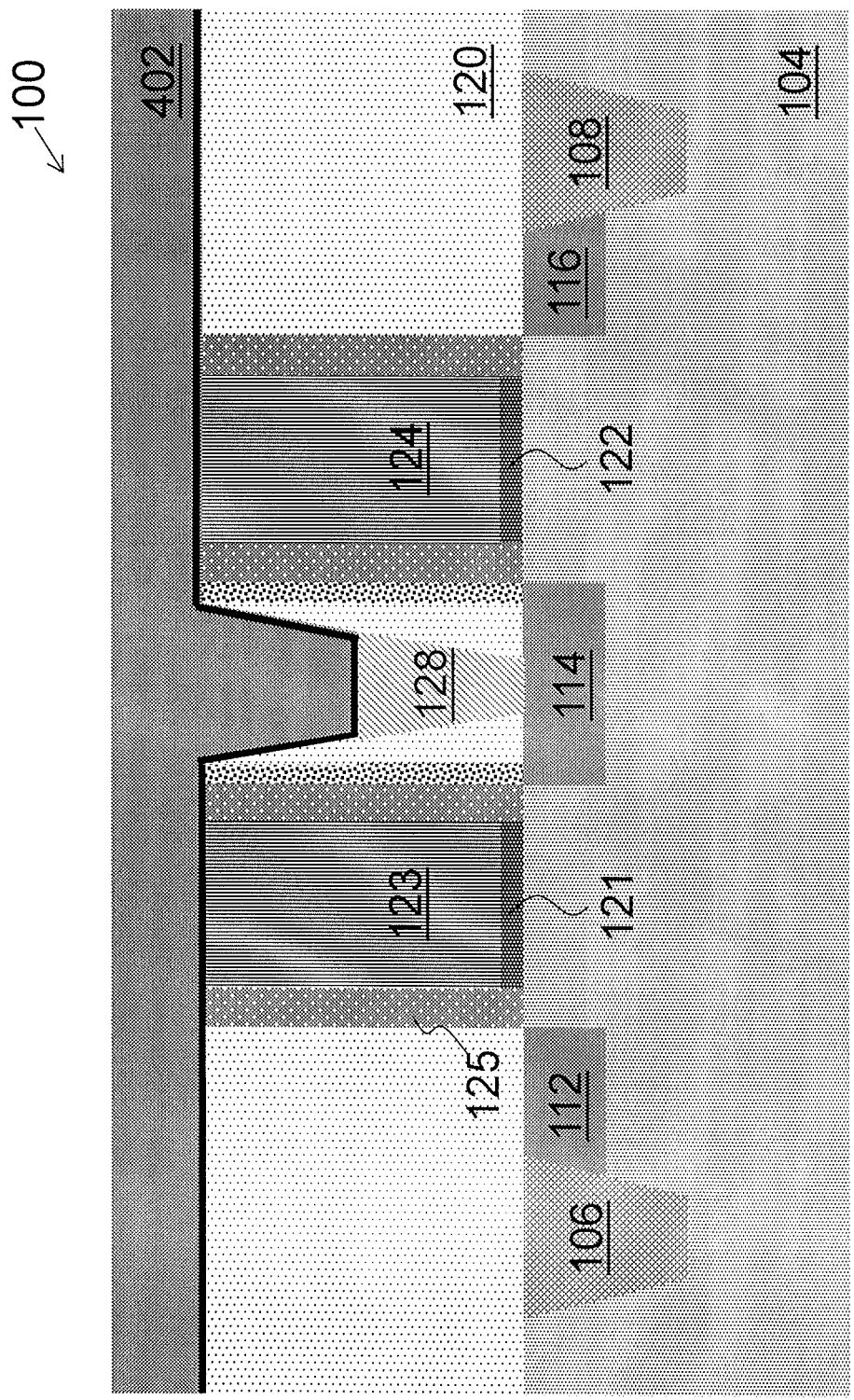

FIG. 4 illustrates a cross sectional view of the semiconductor device shown in FIG. 3 after a dielectric layer 402 is formed over the etch stop layer 302 in accordance with various embodiments of the present disclosure. The dielectric layer 402 is formed over the etch stop layer 302. The dielectric layer 402 may be formed of a dielectric material such as an oxide or silicon nitride, although other suitable dielectrics, such as a high-k dielectric, may alternatively be used. The dielectric layer 402 may be formed using a PECVD process, although any other suitable process may alternatively be used.

Figure 5:
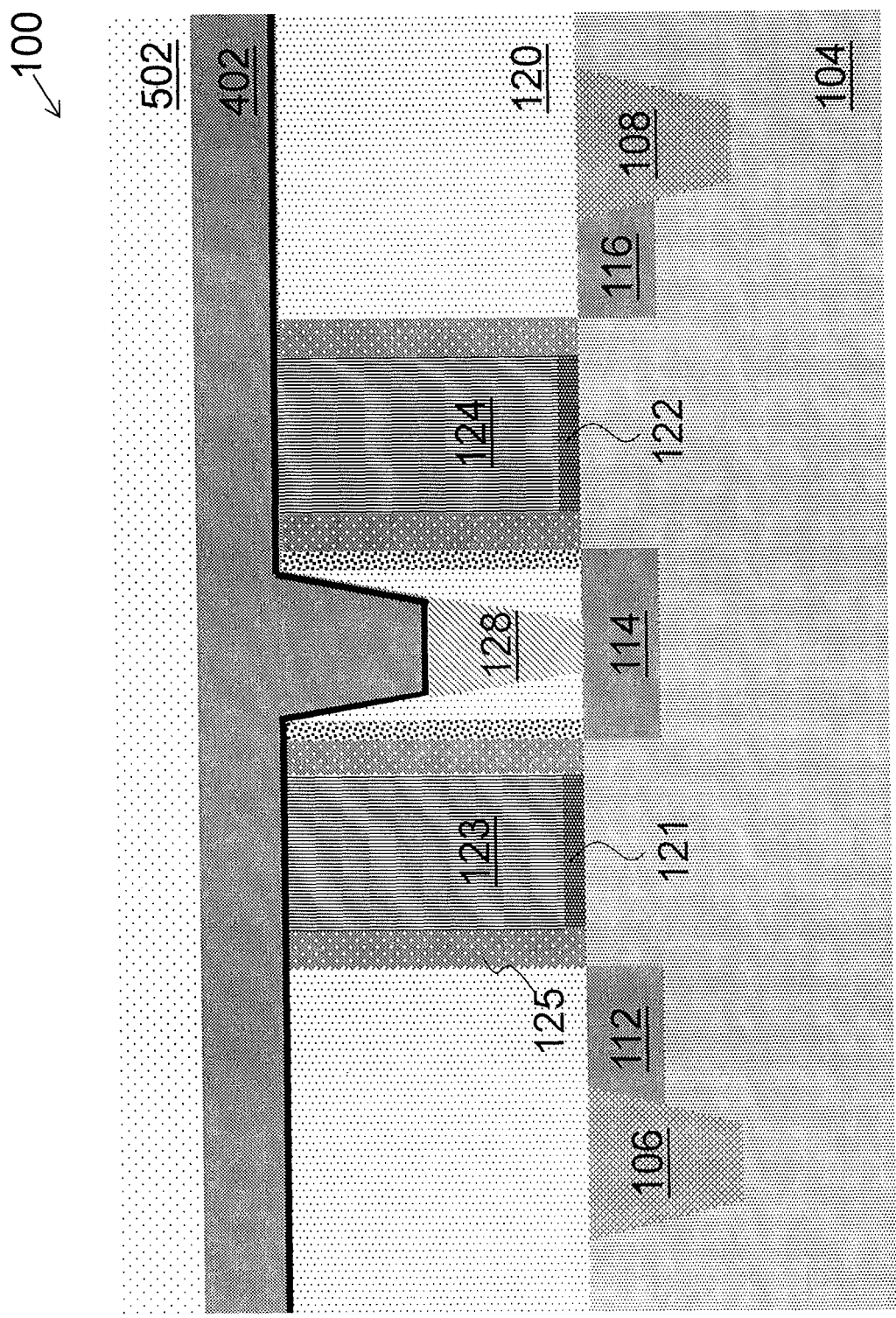

FIG. 5 illustrates a cross sectional view of the semiconductor device shown in FIG. 4 after a mask layer 502 is formed over the dielectric layer 402 in accordance with various embodiments of the present disclosure. The mask layer 502 is deposited over the dielectric layer 402. In some embodiments, the mask layer 502 may be made of a photoresist material. Throughout the description, the mask layer 502 may be alternatively referred to as a photoresist layer 502.

The photoresist layer 502 may be formed by suitable techniques such as spin coating and the like. The photoresist material may be SU-8 (registered trademark of Shell Chemicals) photo-sensitive epoxy, film type polymer materials and/or the like. It should be noted that one skilled in the art will recognize while FIG. 5 illustrates a single photoresist layer, the photoresist layer 502 may comprise a plurality of photoresist layers.

Figure 6:
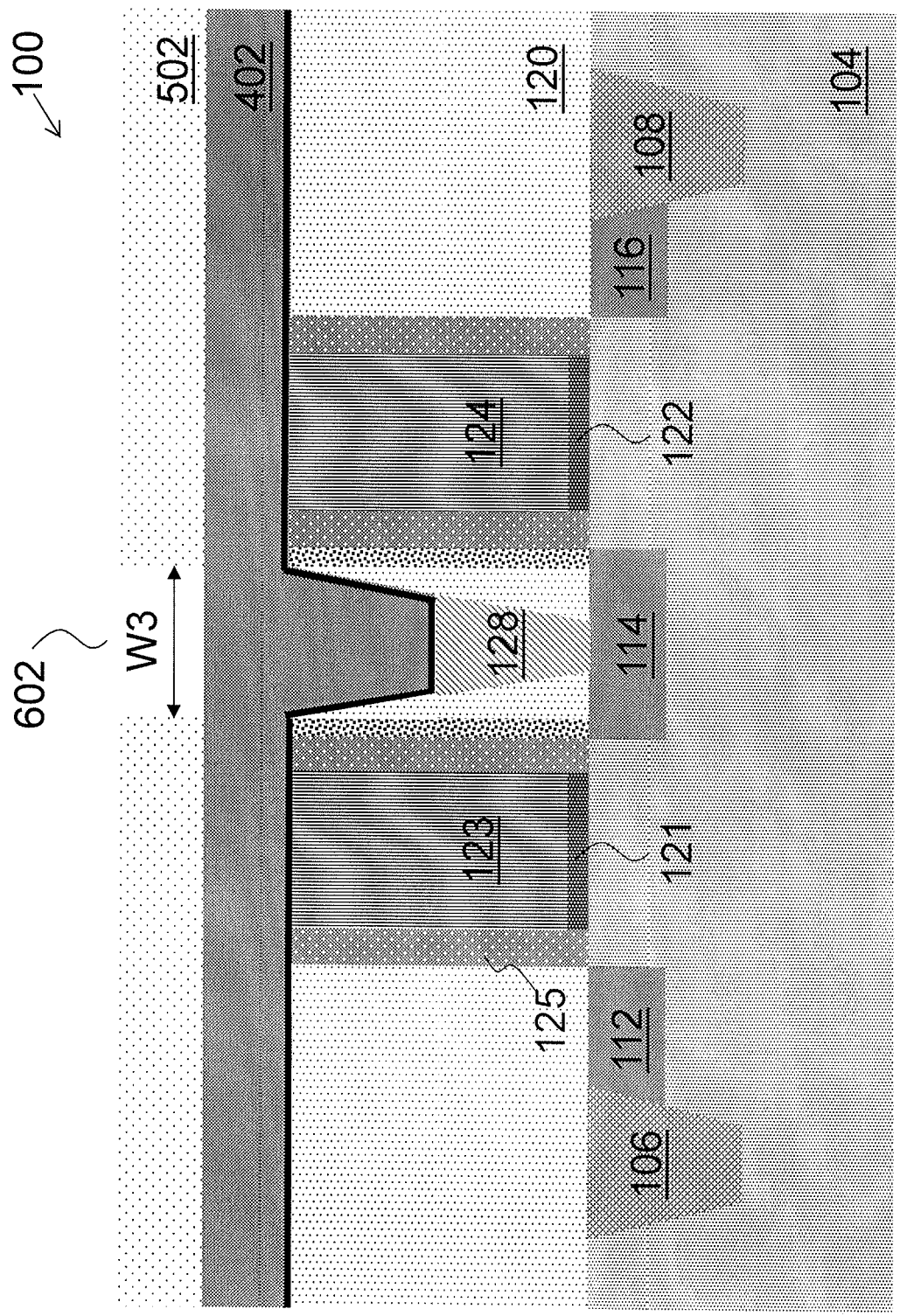

FIG. 6 illustrates a cross sectional view of the semiconductor device shown in FIG. 5 after an opening 602 is formed in the photoresist layer 502 in accordance with various embodiments of the present disclosure. In consideration with the location and size of the upper drain contact 130 shown in FIG. 1, selective areas of the photoresist layer 502 are exposed to light. A developer is applied to the photoresist layer 502. As a result of applying the developer to the photoresist layer 502, the opening 602 is formed in the photoresist layer 502.

In some embodiments, the outermost edge of the opening 602 is substantially aligned with the outermost edge of the opening 202 shown in FIG. 2. The width of opening 602 is defined as W3 as shown in FIG. 6.

After the photoresist layer 502 is patterned, there may be two photoresist material regions formed on top of the dielectric layer 402 as shown in FIG. 6. The remaining photoresist regions help to prevent the dielectric layer 402 underneath the photoresist layer 502 from being etched away during the etching process described below with respect to FIG. 7.

Figure 7:
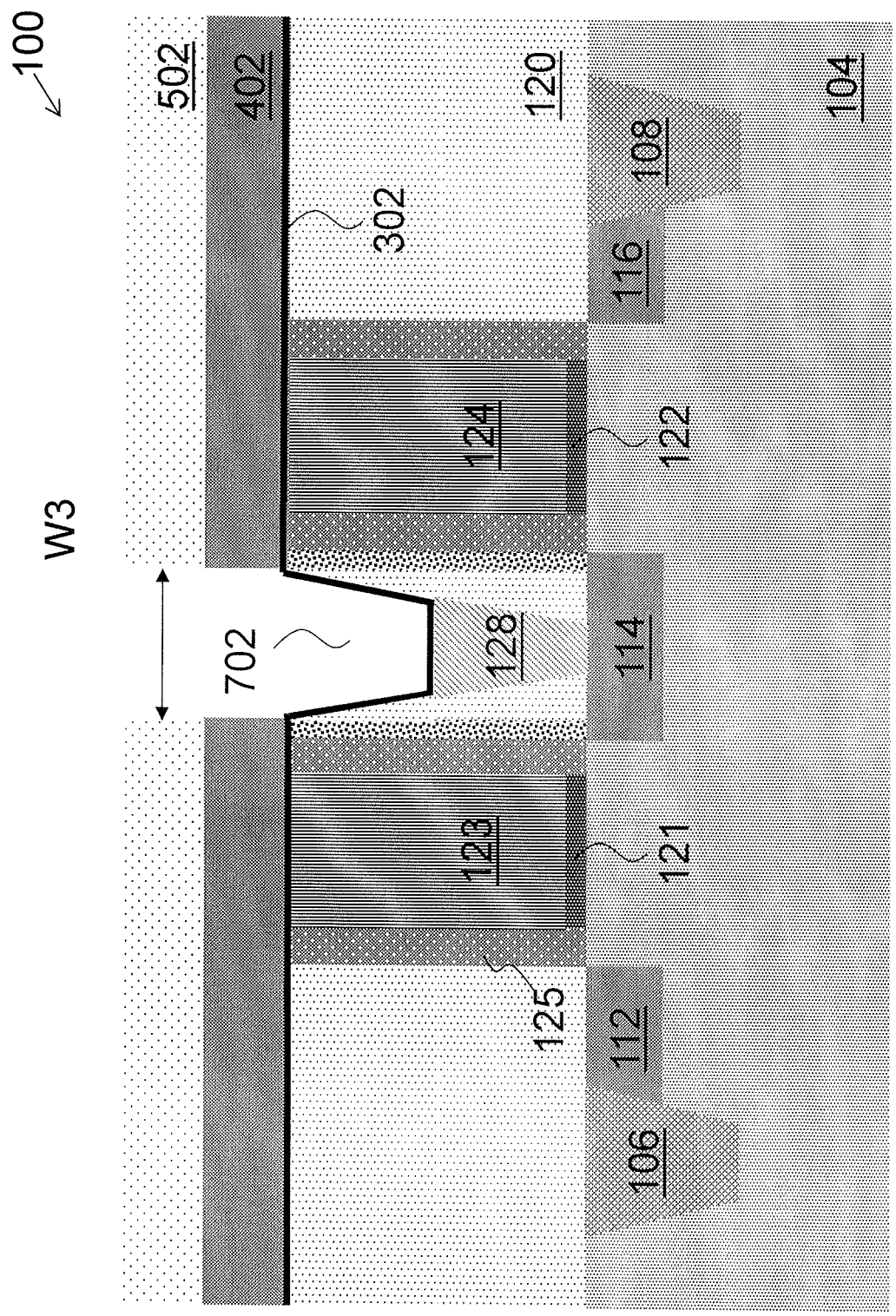

FIG. 7 illustrates a cross sectional view of the semiconductor device shown in FIG. 6 after an etching process is applied to the semiconductor device in accordance with various embodiments of the present disclosure. An etching process such as a dry etching is applied to the semiconductor device 100. According to the pattern shown in FIG. 6, the exposed portion of the dielectric layer 402 is removed as a result. With the help of the etch stop layer 302, the etching of the dielectric layer 402 is more precisely controlled. As shown in FIG. 7, the etching process leads to an opening 702 over the lower drain contact 128.

One advantageous feature of having the etch stop layer 302 is the high selectivity of the etch stop layer 302 helps to avoid the over-etch issue, thereby protecting the top surface of the lower drain contact 128 from being damaged when the etching process is applied to the dielectric layer 402.

Figure 8:
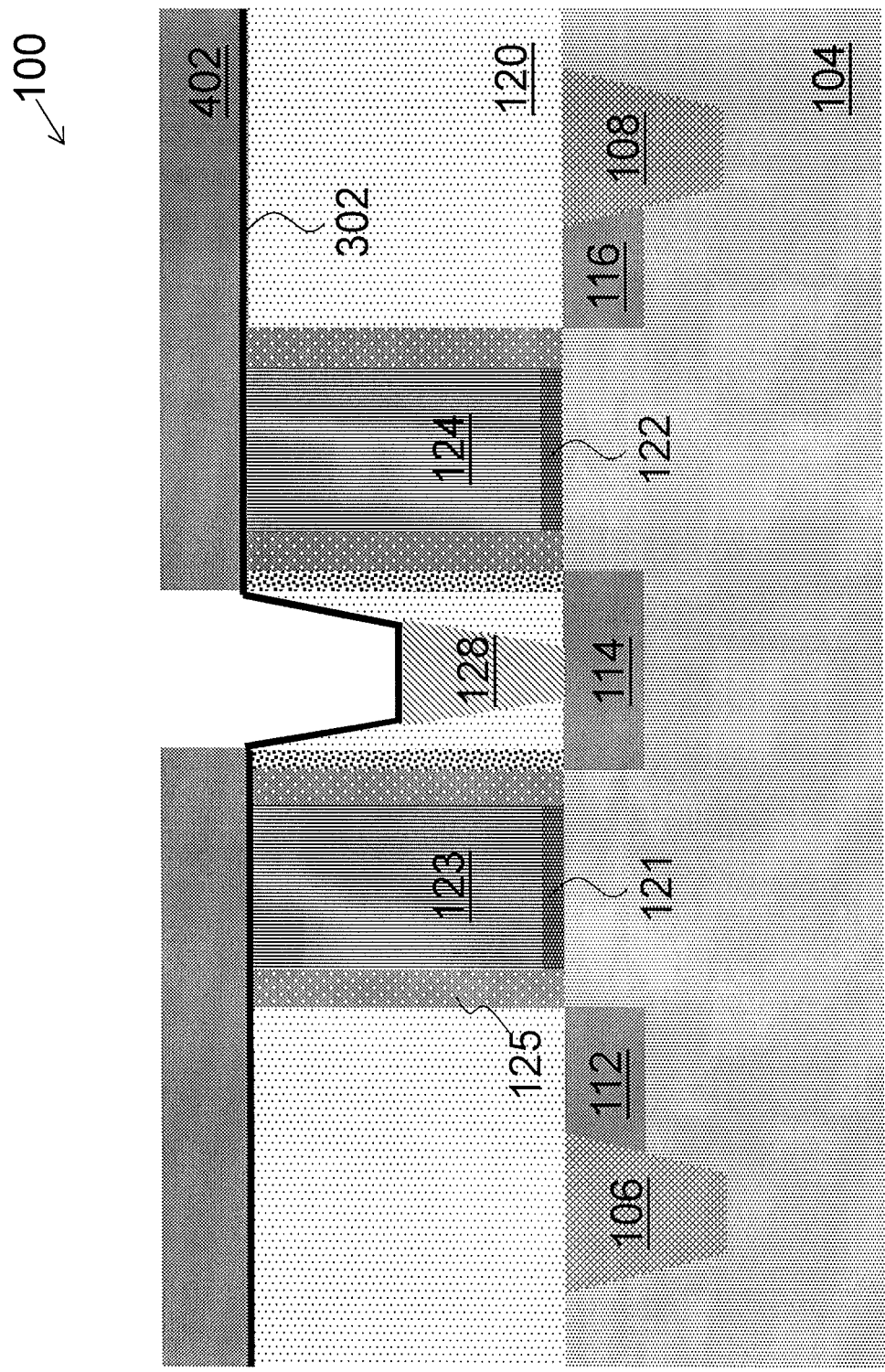

FIG. 8 illustrates a cross sectional view of the semiconductor device shown in FIG. 7 after the remaining photoresist layer has been removed from the semiconductor device in accordance with various embodiments of the present disclosure. The remaining photoresist layer shown in FIG. 7 may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 9:
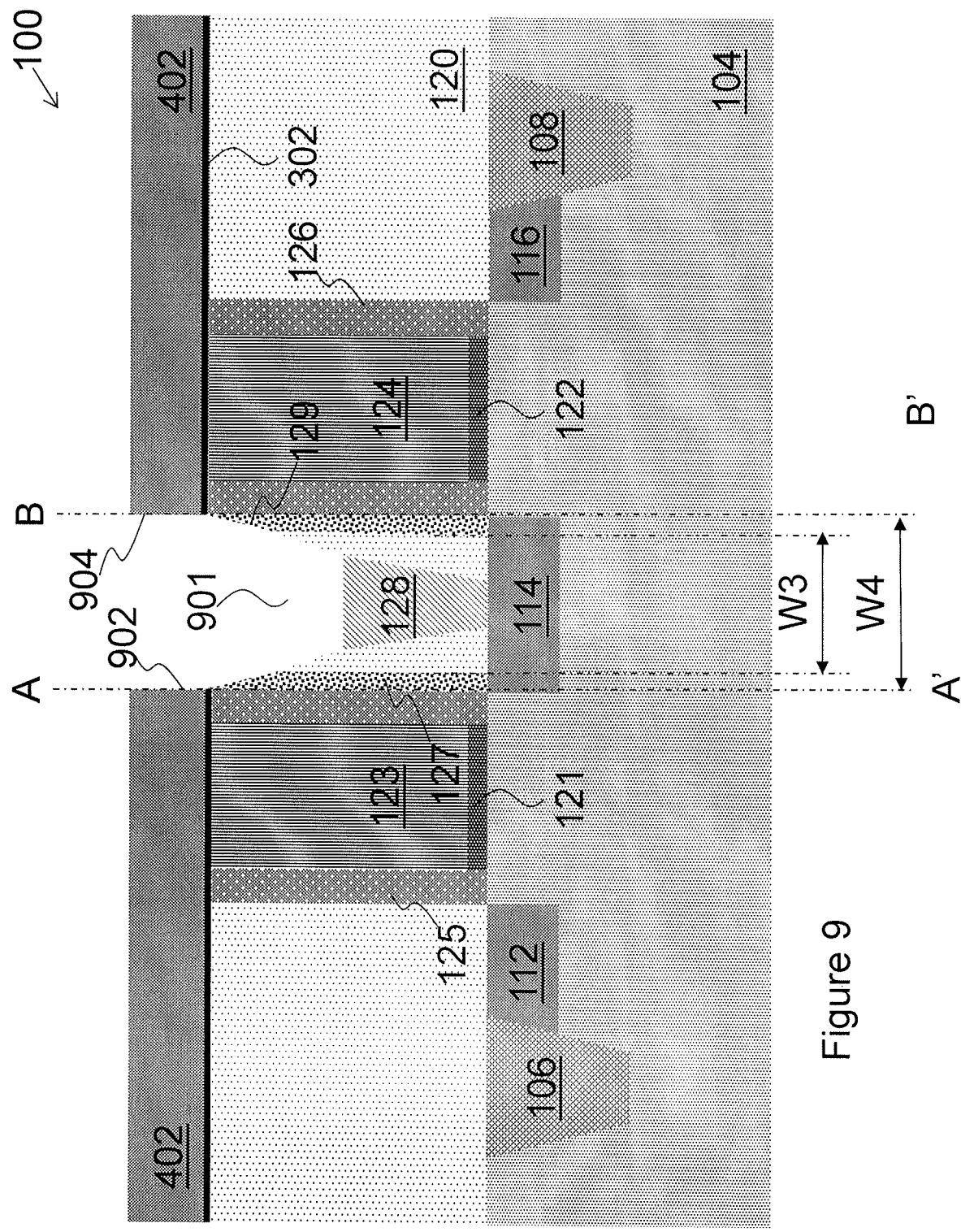

FIG. 9 illustrates a cross sectional view of the semiconductor device shown in FIG. 8 after an etching process is applied to the etch stop layer 302 in accordance with various embodiments of the present disclosure. The exposed etch stop layer 302 (shown in FIG. 8) may be removed by using a suitable etching process such as wet-etching, dry-etching and/or the like.

In some embodiments, the exposed etch stop layer 302 is removed by a wet etching process in which a cleaning solution is applied to the etch stop layer 302. In some embodiments, the cleaning solution is a hydrofluoric acid (HF) based cleaning solution, an aqueous ammonia (NH4OH) based cleaning solution, a Hydroxylamine based cleaning solution, any combinations thereof and the like.

The semiconductor device 100 may be heated before and/or during the process of applying the cleaning solution to the etch stop layer 302. In an embodiment, the semiconductor device 100 is heated to about 40 degrees C. The time of removing the exposed etch stop layer 302 is about 30 seconds. In an alternative embodiment, the semiconductor device 100 is heated to about 60 degrees C. The time of removing the exposed etch stop layer 302 is about 10 seconds.

In order to have an enlarged opening, the etching process is controlled such that portions of the protection layers 127, 129 and the dielectric layer 402 are removed. In particular, after the etching process finishes, a first edge 902 of the dielectric layer 402 is vertically aligned with the outermost edge of the first gate spacer 125 as indicated by the dashed line A-A'. Likewise, a second edge 904 of the dielectric layer 402 is vertically aligned with the outermost edge of the second gate spacer 126 as indicated by the dashed line B-B'. In an alternative embodiment, the first edge 902 of the dielectric layer 402 is substantially aligned with the outermost edge of the first gate spacer 125. The second edge 904 of the dielectric layer 402 is substantially aligned with the outermost edge of the second gate spacer 126.

Furthermore, the top surface of the first protection layer 127 has a first slope extending downward from an edge of the top surface of the first gate spacer 125. The top surface of the second protection layer 129 has a second slope extending downward from an edge of the top surface of the second gate spacer 126. As shown in FIG. 9, the rate of change of the top surface of the first protection layer 127 is substantially equal to the rate of change of the top surface of the second protection layer 129.

It should be noted that the protection layers 127 and 129 are formed by a high temperature deposition process. As described above with respect to FIG. 2, the protection layers 127 and 129 are formed by an ALD process and a preheating process is used to increase the temperature of the ALD process to a range from about 550 degrees C. to 600 degrees C. In contrast, the dielectric layer 402 is formed by a CVD process having a process temperature of about 500 degrees C. The different deposition process temperatures lead to different etching rates when the wet etching process is applied to the protection layers and the dielectric layer 402. Such different etching rates help to form different surfaces at the protection layers and the dielectric layer 402.

After the etching process finishes, an opening 901 is formed over the lower drain contact 128. The opening 901 includes two portions. A first portion of the opening 901 has a rectangular shape. The first portion is in the dielectric layer 402. A second portion of the opening 901 has an inverted-trapezoidal shape. As shown in FIG. 9, the second portion of the opening 901 is in the interlayer dielectric layer 120. The width of the first portion of the opening 901 is defined as W4. Throughout the description, W4 is alternatively referred to as the maximum width of the opening 901.

As shown in FIG. 9, portions of the dielectric layer 402 have been removed during the etching process. The sidewalls of the dielectric layer 402 are aligned with the sidewalls of the gate spacers 125 and 126 respectively. As such, W4 is greater than W3 as shown in FIG. 9. In some embodiments, the ratio of W4 to W3 is in a range from about 1.1 to about 1.3.

Figure 10:
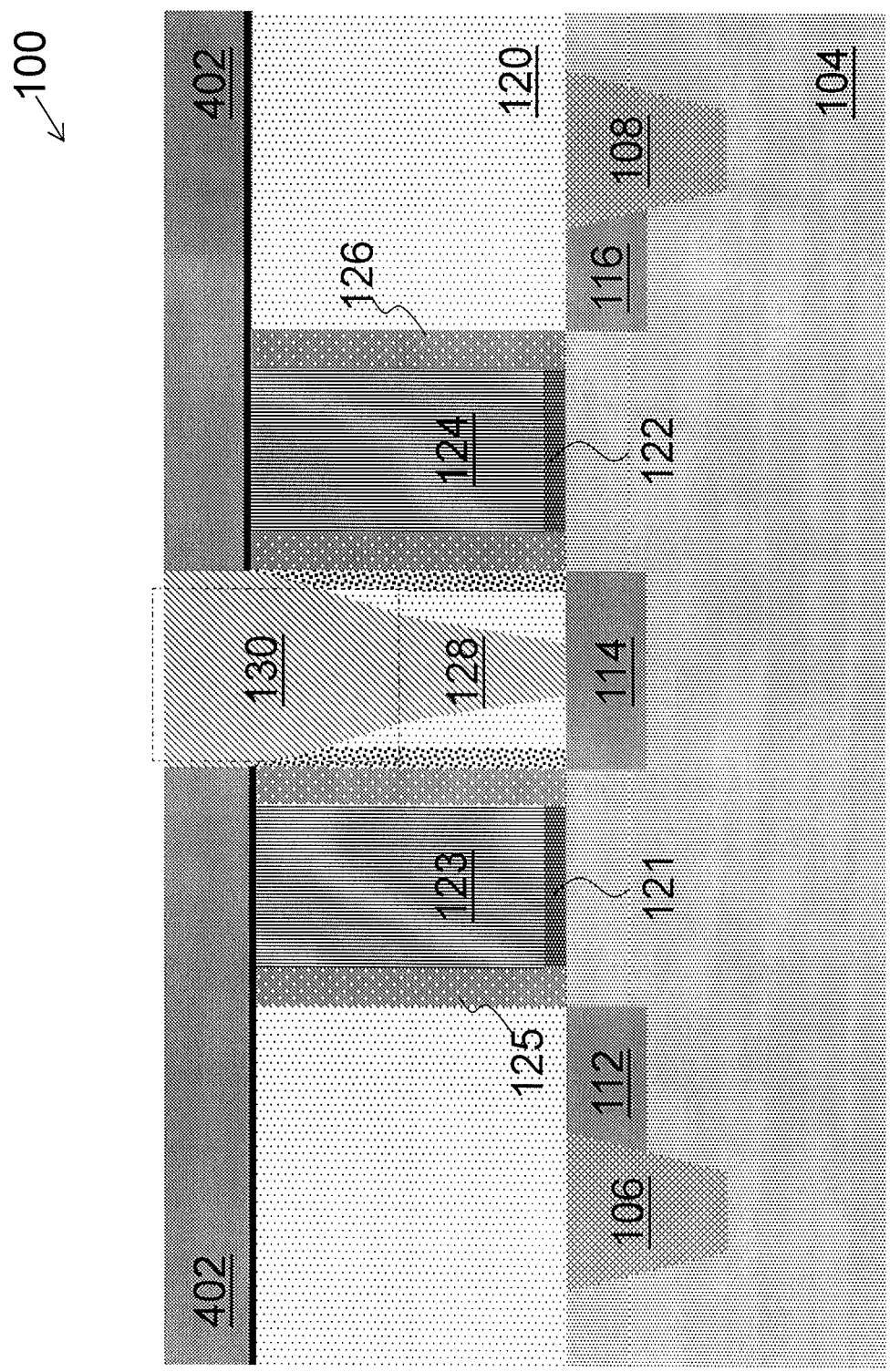

FIG. 10 illustrates a cross section view of the semiconductor device shown in FIG. 9 after a metal material is filled in the opening of the semiconductor device in accordance with various embodiments of the present disclosure. A metallic material, which includes tungsten, titanium, aluminum, copper, any combinations thereof and/or the like, is filled into the opening 901 (shown in FIG. 9). As a result, the upper drain contact 130 is formed over the lower drain contact 128.

As shown in FIG. 10, the upper drain contact 130 includes an upper portion and a lower portion. The upper portion of the upper drain contact 130 has a rectangular shape. The lower portion of the upper drain contact 130 has an inverted-trapezoidal shape. Furthermore, the lower portion of the upper drain contact 130 is in contact with the first slope of the first protection layer 127 and the second slope of the second protection layer 129. A first edge of the upper portion of the upper drain contact 130 is vertically aligned with an outermost edge of the first gate spacer 125. A second edge of the upper portion of the upper drain contact 130 is vertically aligned with an outermost edge of the second gate spacer 126.

Figure 11:
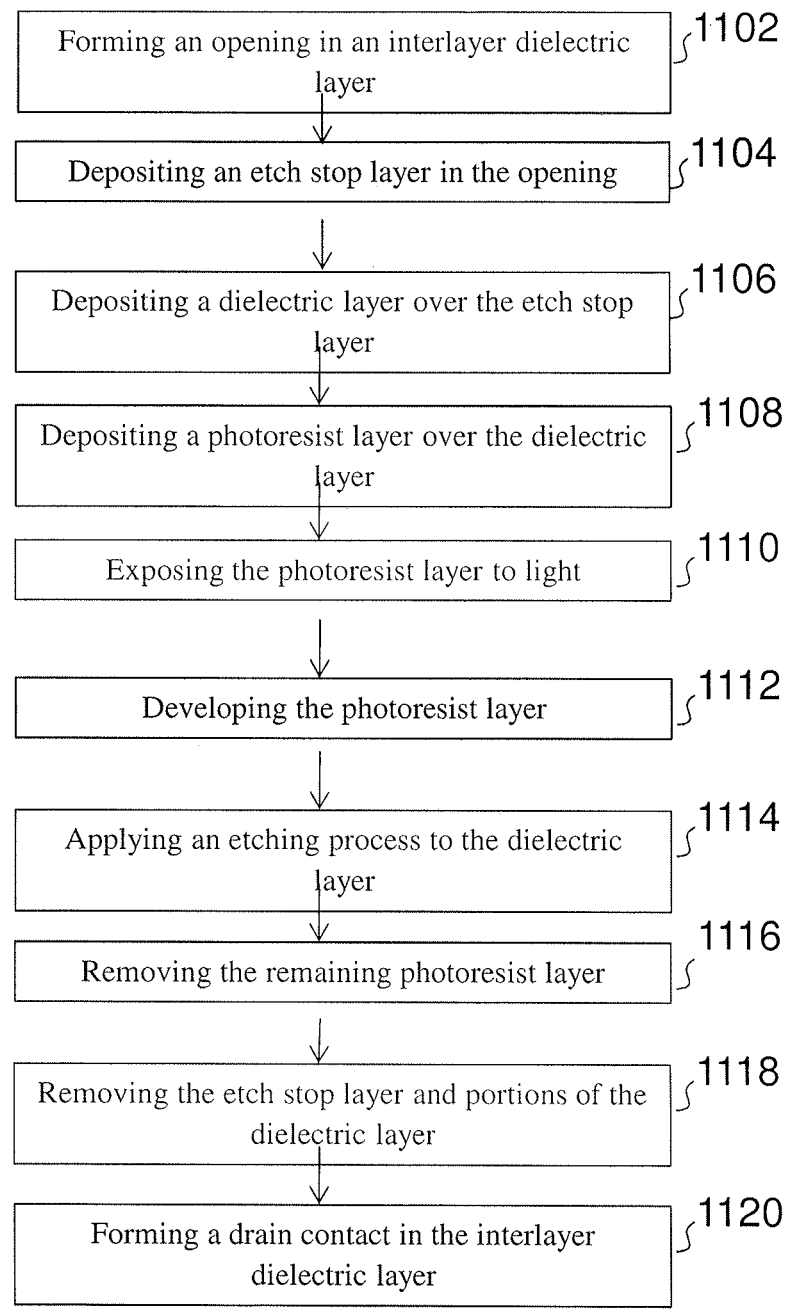
FIG. 11 illustrates a flow chart of a method for forming the semiconductor device shown in FIG. 1 in accordance with various embodiments of the present disclosure.

FIG. 11 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 16 may added, removed, replaced, rearranged and repeated.

At step 1102, a semiconductor device comprising two transistors having a shared drain is provided. A lower drain contact has been formed in an interlayer dielectric layer between two gate electrodes of the two transistors. An opening is formed in the interlayer dielectric layer and over the lower drain contact.

At step 1104, an etch stop layer is deposited in the opening and over the top surface of the interlayer dielectric layer. The etch stop layer is formed of formed of aluminum oxynitride (AlON), aluminum oxide ($Al_2O_3$), aluminum nitride (AlN), hafnium oxide (HfOx), zirconium oxide (ZrOx), and combinations thereof and/or the like.

At step 1106, a dielectric layer is formed over the etch stop layer. The dielectric layer is formed of silicon nitride. The dielectric layer is in the opening and over the interlayer dielectric layer.

At step 1108, a photoresist layer is deposited over the dielectric layer. At step 1110, the photoresist layer is exposed to light according to a predetermined pattern. At step 1112, an opening is formed in the photoresist layer by applying a developer to the photoresist layer.

At step 1114, an etching process is applied to the dielectric layer until the etch stop layer is exposed. At step 1116, the remaining photoresist layer is removed by a suitable photoresist removal process.

At step 1118, the exposed etch stop layer is removed by a suitable etching process. During the process of removing the etch stop layer, the upper portions of the protection layers and portions of the dielectric layer have been removed. In particular, the etching process is controlled such that a first edge of the dielectric layer is vertically aligned with a spacer sidewall of a first transistor; a second edge of the dielectric layer is vertically aligned with a spacer sidewall of a second transistor; a top surface of a first protection layer has a slope extending downward from an edge of a top surface of a first gate spacer of the first transistor; a top surface of a second protection layer has a slope extending downward from an edge of a top surface of a second gate spacer of the second transistor.

At step 1120, through a plating process, a conductive material is filled in the opening to form an upper drain contact. The upper drain contact is on and in contact with the lower drain contact.

Figure 12:
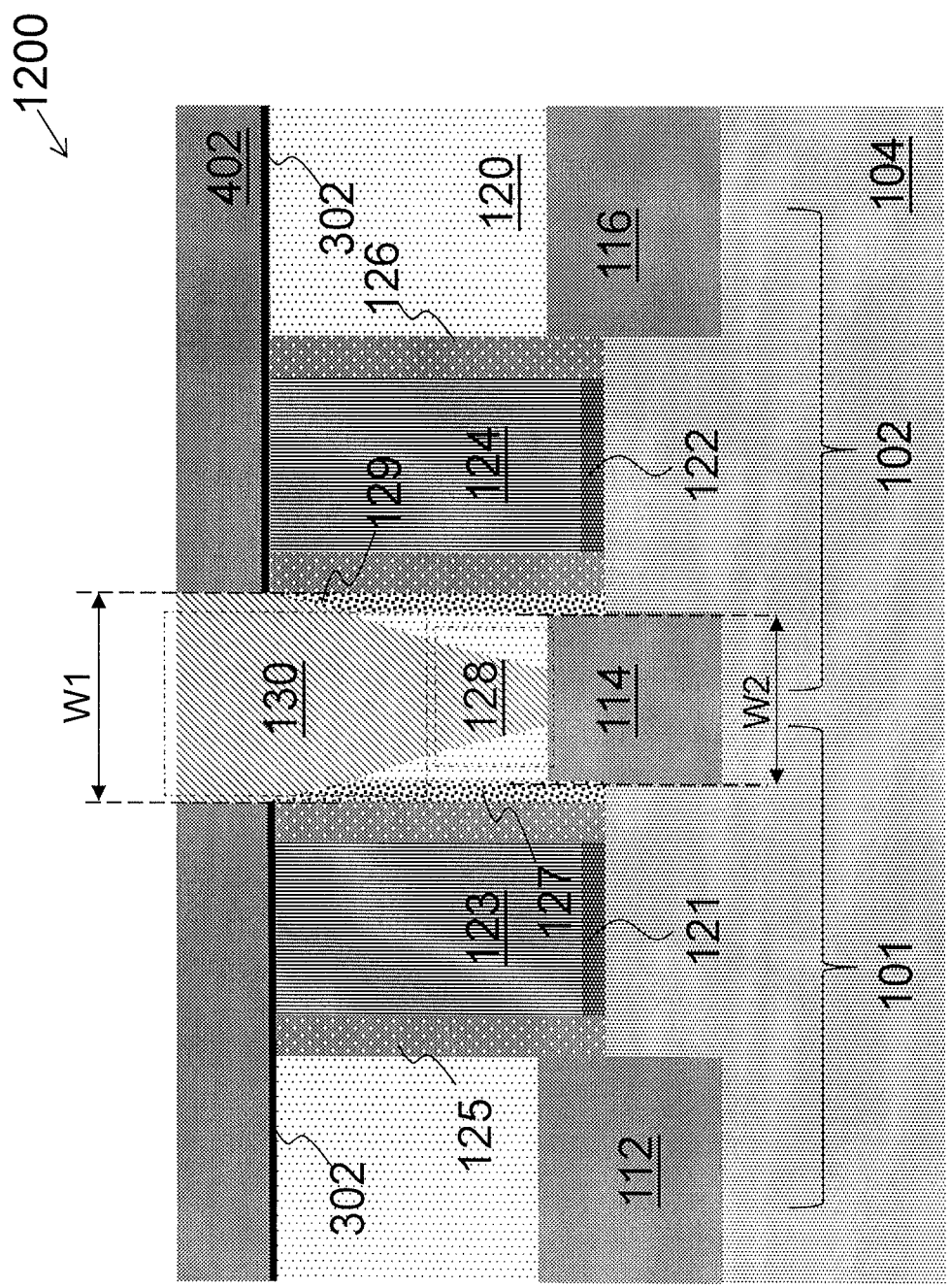
FIG. 12 illustrates a cross sectional view of a FinFET semiconductor device having an enlarged drain/source contact in accordance with various embodiments of the present disclosure.

FIG. 12 illustrates a cross sectional view of a FinFET semiconductor device having an enlarged drain/source contact in accordance with various embodiments of the present disclosure. The drain contact fabrication process shown in FIGS. 2-11 is applied not only to planar transistor devices, but also to FinFET devices. The FinFET semiconductor device 1200 comprises two transistors sharing a common drain. These two transistors are formed over a substrate 104. A first transistor 101 comprises a first gate electrode 123 and its gate dielectric layer 121, a drain 114 and its contacts 128 and 130, and a first source 112 and its contact (not shown). A second transistor 102 comprises a second gate electrode 124 and its gate dielectric layer 122, the drain 114 and its contacts 128 and 130, and a second source 116 and its contact (not shown).

The drain/source regions 112, 114 and 116 may be formed by etching portions of a fin line and growing the drain/source regions 112, 114 and 116 through suitable epitaxial growth processes. As shown in FIG. 12, the top surfaces of the drain/source regions 112, 114 and 116 are higher than the bottom surfaces of the gate electrodes 123 and 124.

The shape of the upper drain contact 130 in FIG. 12 is similar to that shown in FIG. 1, and hence is not discussed in detail to avoid unnecessary repetition. One advantageous feature of having the enlarged drain contact 130 shown in FIG. 12 is the enlarged drain contact helps to reduce the contact resistance, thereby improving the performance of FinFET semiconductor device 1200.

In accordance with an embodiment, an apparatus comprises a first source and a common drain in a substrate and on opposite sides of a first gate, the first gate being surrounded by a first gate spacer, a second source and the common drain in the substrate and on opposite sides of a second gate, the second gate being surrounded by a second gate spacer, a first protection layer formed along a sidewall of the first gate spacer, wherein a top surface of the first protection layer has a first slope, a second protection layer formed along a sidewall of the second gate spacer, wherein a top surface of the second protection layer has a second slope, a lower drain contact between the first gate and the second gate and an upper drain contact over the lower drain contact and between the first gate and the second gate, wherein at least a portion of the upper drain contact is in contact with the first slope and the second slope.

In accordance with an embodiment, a device comprises a first drain/source region and a second drain/source region in a substrate and on opposite sides of a first gate, wherein the second drain/source region and the first gate are separated by a first gate spacer, a third drain/source region and the second drain/source region in the substrate and on opposite sides of a second gate, wherein the second drain/source region and the second gate are separated by a second gate spacer, a first protection layer formed along a sidewall of the first gate spacer, wherein the first protection layer is over the second drain/source region, a second protection layer formed along a sidewall of the second gate spacer, wherein the second protection layer is over the second drain/source region, a lower drain contact between the first protection layer and the second protection layer and an upper drain contact over the lower drain contact and between the first gate and the second gate, wherein a width of the upper drain contact is greater than a width of the lower drain contact.

In accordance with an embodiment, an apparatus comprises a first source and a common drain on opposite sides of a first gate, a second source and the common drain on opposite sides of a second gate, wherein the first gate and the second gate are in an interlayer dielectric layer over a substrate and the first gate and the second gate are surrounded by a first gate spacer and a second gate spacer respectively.

The apparatus further comprises a first protection layer formed along a sidewall of the first gate spacer, wherein the first protection layer is over the common drain and a top surface of the first protection layer has a first slope, a second protection layer formed along a sidewall of the second gate spacer, wherein the second protection layer is over the common drain and a top surface of the second protection layer has a second slope and a first drain contact formed between the first gate and the second gate, wherein a width of an upper portion of the first drain contact is greater than a width of a lower portion of the first drain contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first dielectric layer over a substrate;
    forming a first opening in the first dielectric layer to expose a conductive feature;
    depositing an etch stop layer in the first opening and on a top surface of the first dielectric layer;
    depositing a second dielectric layer over the etch stop layer;
    depositing a photoresist layer on the second dielectric layer;
    patterning the photoresist layer to form a second opening in the photoresist layer;
    applying a first etching process to the second dielectric layer to form a third opening in the second dielectric layer, the third opening exposing the etch stop layer;
    performing a second etching process on the etch stop layer to form a fourth opening, the fourth opening exposing the conductive feature, a width of the fourth opening in the second dielectric layer being greater than a width of the third opening in the second dielectric layer; and
    filling the fourth opening with a conductive material.

2. The method of claim 1, wherein the conductive feature comprises a source/drain contact.

3. The method of claim 2, wherein the source/drain contact is interposed between a first gate electrode and a second gate electrode.

4. The method of claim 3, wherein the conductive material extends lower than an upper surface of the first gate electrode and the second gate electrode.

5. The method of claim 3, wherein a third dielectric layer extends along a sidewall of the first gate electrode and a fourth dielectric layer extends along a sidewall of the third dielectric layer, the third dielectric layer being interposed between the first gate electrode and the fourth dielectric layer, wherein performing the second etching process comprises removing portions of the fourth dielectric layer.

6. The method of claim 1, wherein an outermost edge of the second opening is aligned with an outermost edge of the first opening.

7. The method of claim 1, wherein the etch stop layer comprises aluminum oxynitride, aluminum oxide, aluminum nitride, hafnium oxide, or zirconium oxide.

8. A method comprising:
forming a first opening in a first dielectric layer, wherein the first opening exposes a conductive feature;
depositing an etch stop layer on the conductive feature in the first opening and over an upper surface of the first dielectric layer;
depositing a second dielectric layer over the etch stop layer in the first opening and over the upper surface of the first dielectric layer;
performing a first etching process to form a second opening in the second dielectric layer, the second opening exposing the etch stop layer in the first opening;
performing a second etching process to widen the second opening and extend through the etch stop layer, thereby forming a third opening; and
filling the third opening with a conductive material.

9. The method of claim 8 further comprising:
forming a first transistor and a second transistor over a substrate, wherein:
the first transistor comprises a first gate structure; and
the second transistor comprises a second gate structure, the first transistor and the second transistor having a shared source/drain; and
forming a first dielectric layer adjacent the first gate structure and the second gate structure, wherein performing the second etching process removes portions of the first dielectric layer.

10. The method of claim 9, wherein the conductive material completely covers an upper surface of the first dielectric layer in a cross-sectional view.

11. The method of claim 9 further comprising:
forming a second dielectric layer adjacent the first gate structure and the second gate structure, wherein the second dielectric layer is interposed between the first gate structure and the first dielectric layer and between the second gate structure and the first dielectric layer, wherein second etching process does not thin the second dielectric layer.

12. The method of claim 11, wherein the conductive material extends along sidewalls of the second dielectric layer.

13. The method of claim 8, wherein the etch stop layer comprises aluminum oxynitride, aluminum oxide, aluminum nitride, hafnium oxide, or zirconium oxide.

14. The method of claim 8, wherein sidewalls of the conductive feature have a first slope, sidewalls of the conductive material have a second slope different than the first slope.

15. The method of claim 8, wherein a sidewall of the conductive material in the second dielectric layer has a first slope, a sidewall of the conductive material below the second dielectric layer has a second slope different than the first slope.

16. A method comprising:
forming a first trench in a first dielectric layer, wherein a bottom of the first trench comprises a conductive feature;
depositing an etch stop layer in the first trench, the etch stop layer extending over the conductive feature;
depositing a second dielectric layer over the etch stop layer in the first trench;
performing a first etching process to remove the second dielectric layer in the first trench;
performing a second etching process to remove the etch stop layer in the first trench and expose the conductive feature; and
forming a conductive material over the conductive feature.

17. The method of claim 16, wherein the second etching process widens the first trench.

18. The method of claim 16, wherein the first dielectric layer comprises a third dielectric layer and a fourth dielectric layer, wherein after forming the etch stop layer the third dielectric layer is interposed between the etch stop layer and the fourth dielectric layer.

19. The method of claim 18, wherein the second etching process removes portions of the fourth dielectric layer.

20. The method of claim 18, wherein the conductive material extends completely over an upper surface of the third dielectric layer and an upper surface of the fourth dielectric layer from the conductive feature to a distal sidewall of the fourth dielectric layer from the conductive feature in a cross-sectional view.

* * * * *